(12) United States Patent
Lee

(10) Patent No.: US 8,258,566 B2
(45) Date of Patent: Sep. 4, 2012

(54) EEPROM DEVICE AND METHOD OF MANUFACTURING THE SAME

(75) Inventor: Hyung-Keun Lee, Mapo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 270 days.

(21) Appl. No.: 12/648,945

(22) Filed: Dec. 29, 2009

(65) Prior Publication Data

US 2010/0163956 A1    Jul. 1, 2010

(30) Foreign Application Priority Data

Dec. 30, 2008 (KR) .................. 10-2008-0137592

(51) Int. Cl.
*H01L 29/788* (2006.01)
(52) U.S. Cl. .................... 257/316; 257/E29.3
(58) Field of Classification Search .................. None
See application file for complete search history.

(56) References Cited

U.S. PATENT DOCUMENTS

| | | | |
|---|---|---|---|
| 6,172,392 B1* | 1/2001 | Schmidt et al. | 257/315 |
| 6,788,574 B1* | 9/2004 | Han et al. | 365/185.08 |
| 6,841,447 B1* | 1/2005 | Logie et al. | 438/264 |
| 6,953,974 B2* | 10/2005 | Rathfelder et al. | 257/381 |
| 7,531,864 B2* | 5/2009 | Maemura et al. | 257/314 |
| 7,919,368 B2* | 4/2011 | Wu et al. | 438/238 |
| 2006/0017094 A1* | 1/2006 | Kim et al. | 257/315 |
| 2007/0152262 A1* | 7/2007 | Han, II | 257/317 |

* cited by examiner

*Primary Examiner* — Benjamin Sandvik
(74) *Attorney, Agent, or Firm* — Sherr & Vaughn, PLLC

(57) ABSTRACT

An EEPROM device may have, at the region where the control gate is formed, a gate oxide layer having a relatively smaller thickness than the gate oxide layer of the tunneling region by removing the gate oxide layer, at a predetermined thickness, at the region where the control gate is formed. Thus, integration of an EEPROM device may be maximized as a result of minimizing the area of the control gate.

9 Claims, 4 Drawing Sheets

EEPROM DEVICE AND METHOD OF MANUFACTURING THE SAME

The present application claims priority under 35 U.S.C. 119 to Korean Patent Application No. 10-2008-0137592 (filed on Dec. 30, 2008), which is hereby incorporated by reference in its entirety.

BACKGROUND

In general, flash memories have the advantage of not losing stored data even if power is cut, such that they are widely used for storing data for a PC Bios, a set-top box, a printer, and a network server, etc., and recently, also used in digital cameras and mobile phones. In these flash memories, EEPROM type flash memory devices, which have a function of electrically erasing data of memory cells in a package or a sector unit, increases threshold voltage of a cell transistor by generating channel hot electrons at a drain in programming and accumulating the electrons in a floating gate. On the contrary, they decrease the threshold voltage of the cell transistor by generating high voltage between a source/substrate and the floating gate to discharging the electrons accumulated in the floating gate. These EEPROM devices can be categorized as a single poly EEPROM and a double poly EEPROM, in accordance with the manufacturing technology and the number of polysilicon layers utilized.

FIG. 1 is a view showing a related single poly EEPROM and FIG. 2 is a cross-sectional view of the single poly EEPROM of FIG. 1. A single poly EEPROM is largely composed of a tunneling region A, a read transistor B, and a control gate C, etc. In order not to perform operations of programming and erasing, the EEPROM requires a large amount of capacitance ratio between the tunneling region A and the control gate C, and it is required to apply a relatively large voltage to the tunneling region A and a relatively small voltage to the control gate C to achieve the capacity difference.

The overlap area of a polysilicon layer on the tunneling region A and the control gate C may be made different to achieve the capacity difference. However, this method which can result in making the control gate C, which needs to have a relatively large area, have a relatively large area on semiconductor substrate, and as a result, the integration of the single poly EEPROM is reduced.

FIG. 3 is a simple circuit diagram of a related single poly EEPROM, in which the single poly EEPROM makes the overlap area of a polysilicon layer and an active region in the tunneling region A and the control gate C different so that the capacities are different in the two regions. In two series capacitors C1 and C2, the areas A1 and A2 are different and the capacities C1 and C2 are correspondingly different, and external bias voltage Vc for programming and erasing is divided in an inversely proportional ratio to each capacity and applied to the capacitors C1 and C2. Accordingly, the capacitor C1 having small capacity (e.g. small area) is applied with a relatively higher voltage than the capacitor C2, thereby generating tunneling. That is, the two capacitors C1 and C2 have relationships of $C1=\epsilon(A1/d)$, $C2=\epsilon(A2/d)$, $C1/C2=A1/A2=V2/V1$, etc.

In the structure of the single poly EEPROM, since there may be a ratio of the overlap area difference so that tunneling is generated at a side and not generated at the other side, the control gate C that is a region where tunneling should not be generated has to have a relatively large area. For example, there may be several tens of times difference between the areas (i.e., a and c) of the polysilicon overlapping at the tunneling region A and the region of the control gate C; therefore, the area of the control gate C occupies a relatively large portion of the area of the single poly EEPROM, which reduces the integration of the single poly EEPROM.

SUMMARY

Embodiments relate to an EEPROM (Electrically Erasable Programmable Read-Only Memory) device. In detail, embodiments relate to an EEPROM device that is suitable for increasing the integration of a device by reducing the area of a control gate of the EEPROM device, and a method of manufacturing a EEPROM device. Embodiments relate to an EEPROM device of which the integrity can be improved by reducing the area of a control gate by adjusting the thickness of a gate oxide layer of a region where the control gate is formed.

An EEPROM device according to embodiments includes: a field oxide layer that defines an active region and a field region of a semiconductor substrate; conductive wells that respectively correspond to a tunneling region, a read transistor, and a control gate, under the active region of the upper surface of the semiconductor substrate; a gate oxide layer that is formed to have a relatively smaller thickness at the control gate than at the tunneling region, on the upper surface of the semiconductor substrate divided by the field oxide layer; and a polysilicon layer that is formed on and/or over the field oxide layer and the gate oxide layer from the tunneling region to the control gate.

A method of manufacturing an EEPROM device according to embodiments, includes: forming conductive wells respectively corresponding to a tunneling region, a read transistor, and a control gate between field oxide layers formed on and/or over a semiconductor device; forming a gate oxide layer on and/or over the conductive wells; removing the gate oxide layer at a predetermined thickness from the control gate; and forming a polysilicon layer on and/or over the field oxide layer and the gate oxide layer.

DRAWINGS

DESCRIPTION

Figure 1:
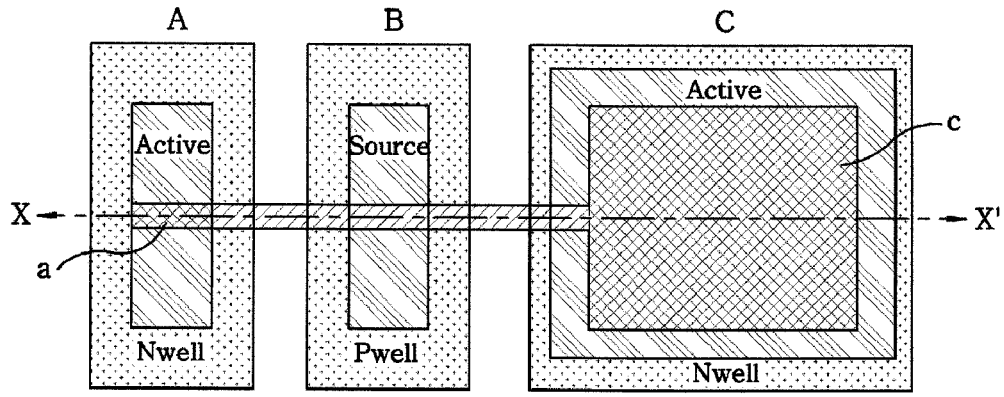
FIG. 1 is a view showing a related single poly EEPROM.
Figure 2:
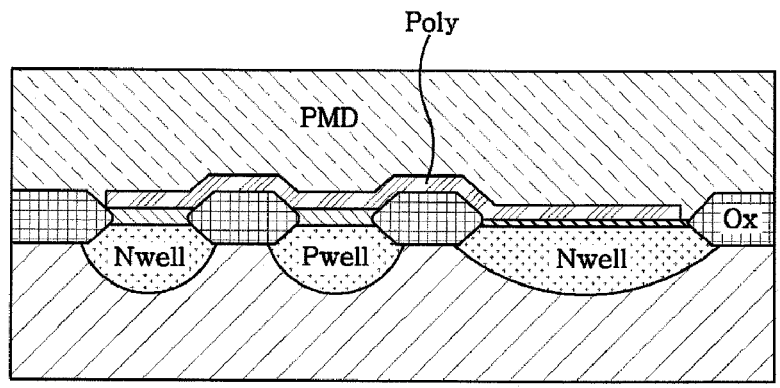
FIG. 2 is a cross-sectional view of the single poly EEPROM of FIG. 1.
Figure 3:
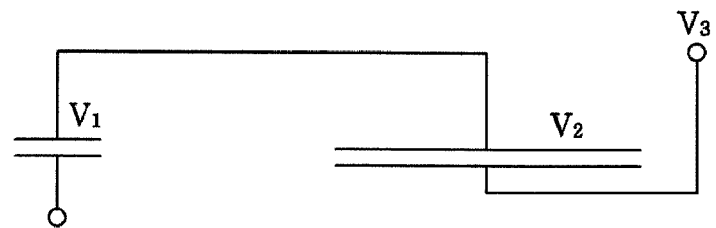
FIG. 3 is a simple circuit diagram of a single poly EEPROM of FIG. 1.
Figure 4:
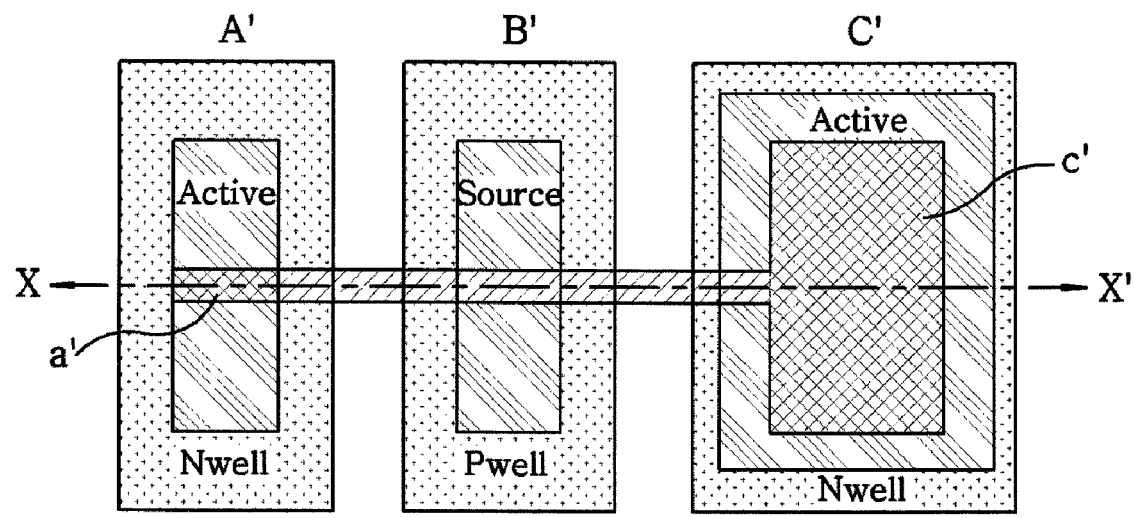
FIG. 4 is a view showing a single poly EEPROM according to embodiments.
Figure 5:
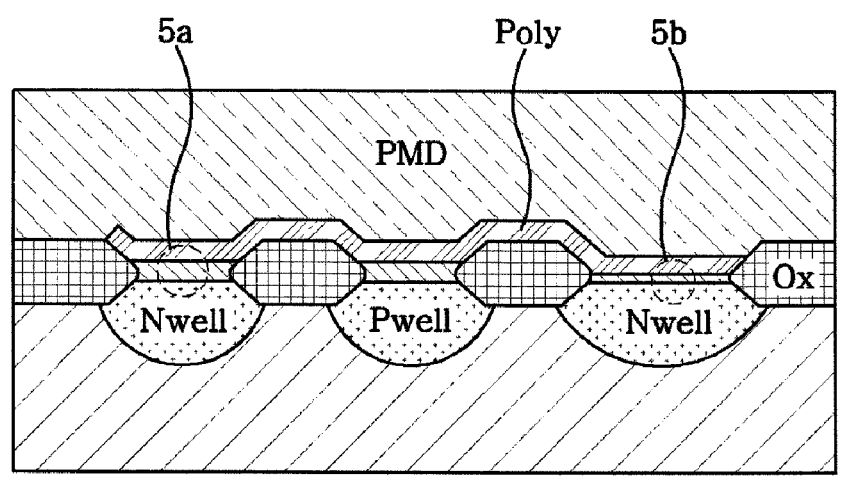
FIG. 5 is a cross-sectional view of a single poly EEPROM according to embodiments.
Figure 6:
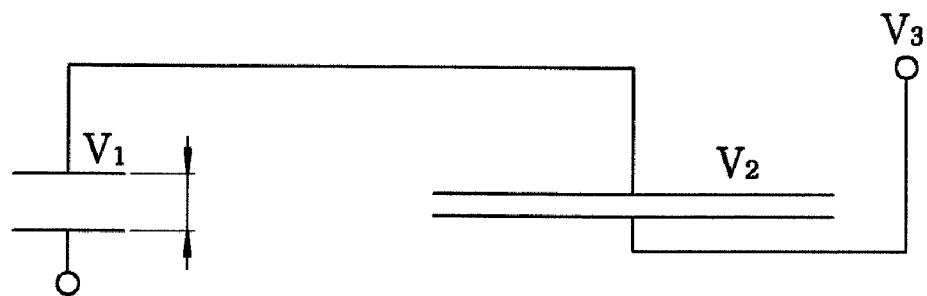
FIG. 6 is a simple circuit diagram of a poly single EEPROM according to embodiments.

FIG. 4 is a view showing a single poly EEPROM according to embodiments. FIG. 5 is a cross-sectional view of a single poly EEPROM according to embodiments. FIG. 6 is a simple circuit diagram of a poly single EEPROM according to embodiments.

Referring to FIGS. 4 to 6, an EEPROM device according to embodiments may include: conductive wells Nwell, Pwell, and Nwell respectively corresponding to a tunneling region A', a read transistor B', and a control gate C', under the surface of a semiconductor substrate; a field oxide layer defining an active region and a field region, a gate oxide layer formed to have a relatively small thickness ($5a>5b$) at the control gate C' than the tunneling region A' on the upper surface of the semiconductor substrate divided by the field oxide layer; a polysilicon layer Poly formed on and/or over the field oxide layer and the gate oxide layer (i.e. Ox) from the tunneling region A' and the control gate C'; and interlayer dielectric layer PMD formed on and/or over the semiconductor substrate on which the polysilicon Poly is formed.

Unlike a related single poly EEPROM having the same thickness of a gate oxide Ox, by making the thickness $5a$ of the gate oxide layer Ox of the tunneling region A' relatively larger than the thickness $5b$ of the gate oxide layer Ox of the control gate C', capacity can be adjusted in accordance with the area and thickness. That is, as the thickness of the gate oxide layer at the control gate C' decreases, the area of the control gate C' can be decreased.

$$\frac{C1}{C2} = \frac{A1d2}{A2d1} = \frac{V2}{V1} \quad \text{Formula 1}$$

As in Formula 1, the capacity is changed as a function of the area and the thickness, such that the capacity changes as much as the thickness ratio of the gate oxide layer Ox. Accordingly, the area of the control gate C' can be decreased, corresponding to the reduction ratio of thickness of the gate oxide layer Ox of the control gate C' with respect to the gate oxide layer Ox of the tunneling region, and the integrity of the EEPROM device can be maximized by adjusting the thickness of the gate oxide layer Ox used for both regions.

Figure 7A:
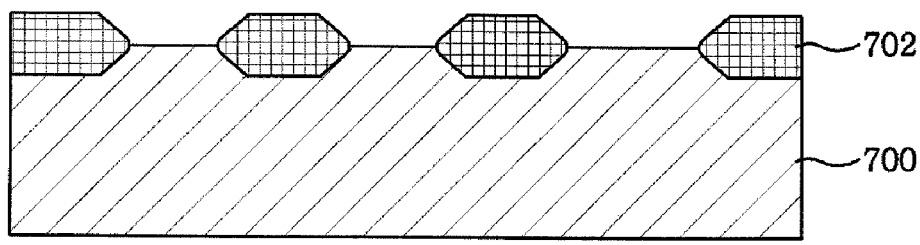
FIGS. 7A to 7D are a sequence of cross-section views illustrating a procedure of manufacturing a single poly EEPROM according to embodiments.
Figure 7B:
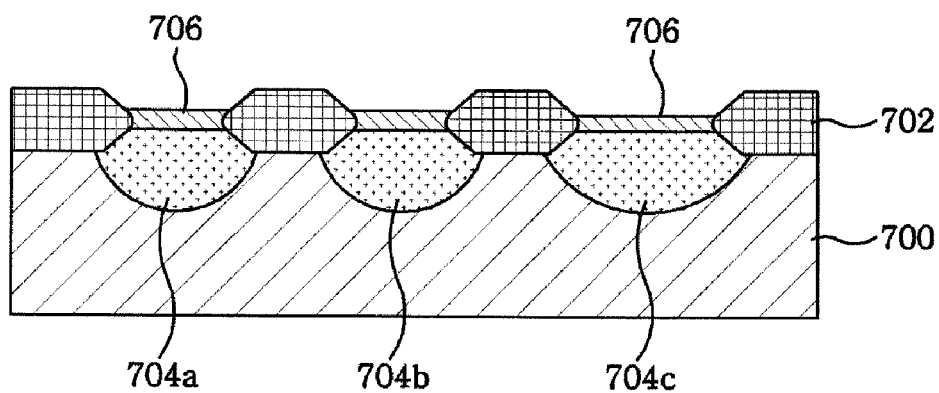

Additionally, FIGS. 7A to 7D are a sequence of cross-section views illustrating a procedure of manufacturing a single poly EEPROM according to embodiments. Referring to FIGS. 7A and 7B, first, a field oxide layer 702 shown in FIG. 7A is formed on and/or over a semiconductor substrate 700 by an ion implantation process or an oxidization process, in accordance with a mask defining an active region and a field region. It should be understood that a dummy oxide layer can be formed to uniformly form the field oxide layer 702 isolating the active region and the field region.

Subsequently, as shown in FIG. 4 and FIG. 7B, the conductive wells 704a, 704b, 704c corresponding to the tunneling region A', read transistor B', and control gate C' may be formed, and then a gate oxide layer 706 is formed at the active region defined by the field oxide layer 702 on and/or over an upper surface of the semiconductor substrate 700, as shown in FIG. 7B. In this configuration, for example, an N-type well can be formed for the conductive wells 704a and 704c respectively corresponding to the tunneling region A' and the control field C', and a P-type well can be formed for the conductive well 704b corresponding to the read transistor B'.

Figure 7C:
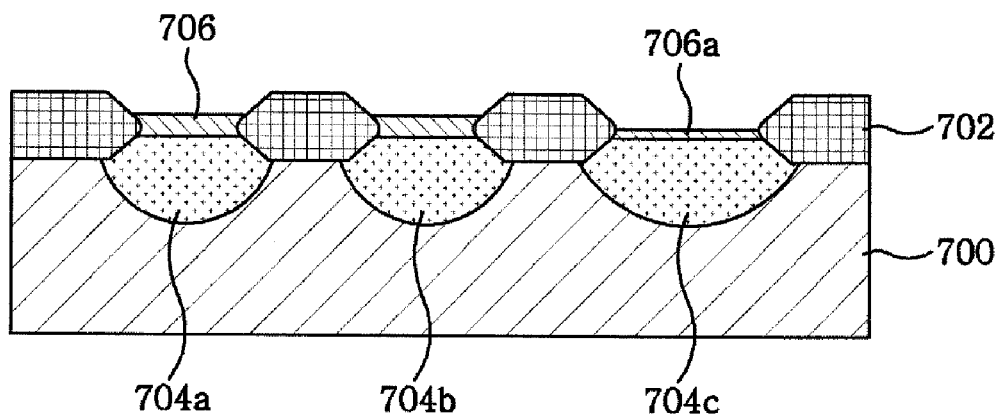

Next, the oxide layer may be removed at a predetermined thickness as shown in FIG. 7C, for example, by a deglaze process, in accordance with a photoresist pattern opening only the gate oxide region corresponding to the control gate C' on the semiconductor substrate 700 with the conductive wells 704a, 704b, and 704c. The predetermined thickness can be set to correspond to the tunneling region A' to acquire a desired capacity ratio with respect to the EEPROM device.

Figure 7D:
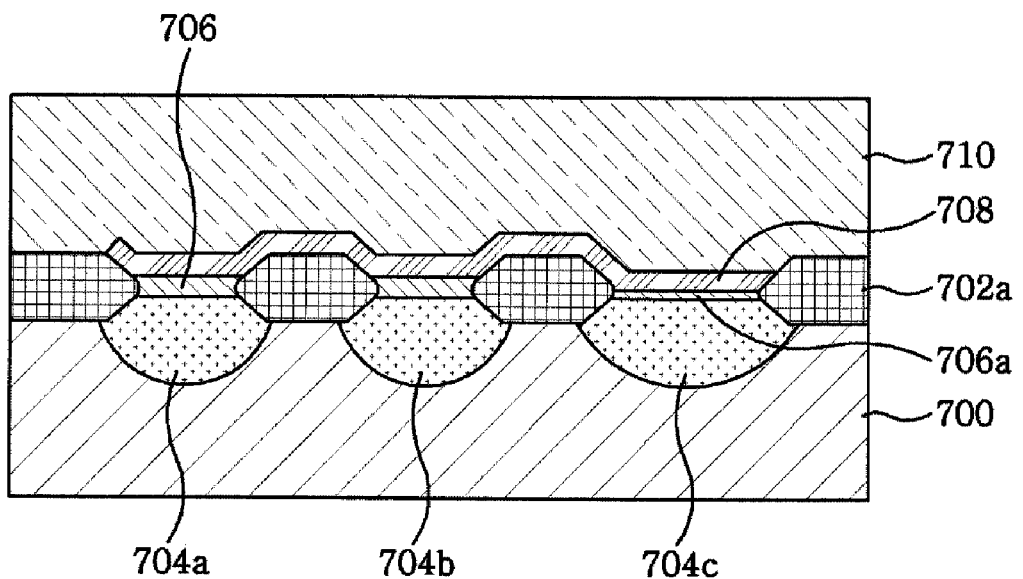

Subsequently, the photoresist pattern may be removed by a predetermined ashing process, a polysilicon layer 708 can be formed from the tunneling region A' to the control gate C' on and/or over the semiconductor substrate 700, and then an interlayer dielectric layer 710 may be formed thereon, as shown in FIG. 7D. In this configuration, the interlayer dielectric layer 710 can be formed, for example, by depositing a dielectric substance, such as TEOS (tetra ethyl ortho silicate), USG (undoped silicate glass), BPSG (boron phosphorus silicate glass), and PSG (phosphorus silicate glass), using CVD (chemical vapor deposition), and then planarizing the upper portion, using, for example, CMP (chemical mechanical polishing).

In accordance with embodiments, an EEPROM device may have, at the region where the control gate is formed, a gate oxide layer having a relatively smaller thickness than the gate oxide layer of the tunneling region by removing the gate oxide layer, at a predetermined thickness, at the region where the control gate is formed. Thus, integration of an EEPROM device may be maximized as a result of minimizing the area of the control gate.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
a field oxide layer that defines an active region and a field region of a semiconductor substrate;
conductive wells that respectively correspond to a tunneling region, a read transistor, and a control gate, under the active region of an upper surface of the semiconductor substrate;
a gate oxide layer that is formed to have a relatively smaller thickness at the control gate than at the tunneling region, on the upper surface of the semiconductor substrate divided by the field oxide layer; and
a polysilicon layer that is formed over the field oxide layer and the gate oxide layer from the tunneling region to the control gate.

2. The device of claim 1, wherein the thickness of the control gate is minimized allowing the gate oxide layer to minimize the area of the control gate.

3. The device of claim 1, wherein the conductive wells respectively corresponding to the tunneling region and the control gate are first conductive types, and the conductive well corresponding to the read transistor is a second conductive type.

4. The device of claim 1, further comprising an interlayer dielectric layer formed over the polysilicon layer.

5. The device of claim 4, wherein the interlayer dielectric layer comprises tetra ethyl ortho silicate.

6. The device of claim 4, wherein the interlayer dielectric layer comprises undoped silcate glass.

7. The device of claim 4, wherein the interlayer dielectric layer comprises boron phosphorus silicate glass.

8. The device of claim 4, wherein the interlayer dielectric layer comprises phosphorus silicate glass.

9. The device of claim 4, wherein a top surface of the interlayer dielectric layer is planarized.

\* \* \* \* \*